United States Patent
Wehner et al.

(10) Patent No.: US 10,702,886 B2
(45) Date of Patent: Jul. 7, 2020

(54) COMPOSITION FOR PRODUCING FILLERS AND METHOD FOR PRODUCING AND PROCESSING THE FILLERS

(71) Applicant: MANKIEWICZ GEBR. & CO. GMBH & CO. KG, Hamburg (DE)

(72) Inventors: Jochen Wehner, Hamburg (DE); Jens Buening, Reppenstedt (DE); Martina Voss, Reinbek (DE)

(73) Assignee: MANKIEWICZ GEBR. & CO. GMBH & CO. KG, Hamburg (DE)

(*) Notice: Subject to any disclaimer, the term of this patent is extended or adjusted under 35 U.S.C. 154(b) by 0 days.

(21) Appl. No.: 16/048,349

(22) Filed: Jul. 30, 2018

(65) Prior Publication Data
US 2018/0333744 A1 Nov. 22, 2018

Related U.S. Application Data

(62) Division of application No. 14/889,860, filed as application No. PCT/DE2014/000240 on May 12, 2014, now Pat. No. 10,076,768.

(30) Foreign Application Priority Data

May 10, 2013 (DE) .................. 10 2013 007 917

(51) Int. Cl.
| | | |
|---|---|---|
| *B05D 1/02* | (2006.01) | |
| *B63B 59/00* | (2006.01) | |
| *C09D 5/34* | (2006.01) | |
| *C09D 7/40* | (2018.01) | |
| *C08K 7/22* | (2006.01) | |
| *C09D 163/00* | (2006.01) | |
| *C23C 14/34* | (2006.01) | |
| *C08G 59/44* | (2006.01) | |
| *C08G 59/50* | (2006.01) | |
| *B05B 12/14* | (2006.01) | |
| *B05B 7/32* | (2006.01) | |

(52) U.S. Cl.
CPC ............ *B05D 1/02* (2013.01); *B63B 59/00* (2013.01); *C08K 7/22* (2013.01); *C09D 5/34* (2013.01); *C09D 7/70* (2018.01); *C09D 163/00* (2013.01); *C23C 14/34* (2013.01); *B05B 7/32* (2013.01); *B05B 12/1418* (2013.01); *C08G 59/44* (2013.01); *C08G 59/50* (2013.01)

(58) Field of Classification Search
None
See application file for complete search history.

(56) References Cited

U.S. PATENT DOCUMENTS

| | | | |
|---|---|---|---|
| 5,143,296 | A | 9/1992 | Saurwein et al. |
| 5,571,312 | A | 11/1996 | Andoe |
| 6,120,837 | A | 9/2000 | Atsuyo et al. |
| 6,573,309 | B1 | 6/2003 | Reitenbach et al. |
| 6,733,472 | B1 | 5/2004 | Epstein et al. |
| 2002/0054957 | A1 | 5/2002 | Johnsen et al. |
| 2002/0064596 | A1 | 5/2002 | Morton |
| 2010/0152373 | A1* | 6/2010 | Wakabayashi ...... C08G 65/2609 524/588 |
| 2011/0095045 | A1 | 4/2011 | Speck et al. |

FOREIGN PATENT DOCUMENTS

| | | |
|---|---|---|
| CN | 101885941 A | 11/2010 |
| CN | 101987928 A | 3/2011 |
| DE | 101 50 601 A1 | 4/2003 |
| DE | 600 34 646 T2 | 1/2008 |
| EP | 0 085 379 A2 | 8/1983 |
| EP | 1 103 310 A1 | 5/2001 |
| JP | 2001-64481 A | 3/2001 |
| WO | WO 02/16519 A2 | 2/2002 |
| WO | WO 2012/035520 A1 | 3/2012 |
| WO | WO-2012035520 A1 * | 3/2012 ............. C09D 5/084 |

OTHER PUBLICATIONS

"SPHERICEL® 60P18", Potters Industries LLC, p. 1 (2011).

* cited by examiner

*Primary Examiner* — Chinessa T. Golden
(74) *Attorney, Agent, or Firm* — Norman B. Thot

(57) ABSTRACT

A composition for producing a putty. The composition includes a binder component with 40 to 95 wt.-% of an epoxy resin based on a total mass of the binder component, a hardener component with 5 to 70 wt.-% of an NH-group-containing compound relative to a total mass of the hardener component, and 0.1 to 15 wt.-% of synthetic hollow bodies based on a total mass of the putty. The synthetic hollow bodies have a density of 0.005 to 0.8 g/cm$^3$.

15 Claims, No Drawings

COMPOSITION FOR PRODUCING FILLERS AND METHOD FOR PRODUCING AND PROCESSING THE FILLERS

CROSS REFERENCE TO PRIOR APPLICATIONS

This application is a divisional of U.S. application Ser. No. 14/889,860, filed on Nov. 9, 2015. U.S. application Ser. No. 14/889,860 is a U.S. National Phase application under 35 U.S.C. § 371 of International Application No. PCT/DE2014/000240, filed on May 12, 2014 and which claims benefit to German Patent Application No. 10 2013 007 917.9, filed on May 10, 2013. The International Application was published in German on Nov. 13, 2014 as WO 2014/180463 A2 under PCT Article 21(2).

FIELD

The present invention relates to compositions for producing putties which are suitable for use in mechanical application processes. The present invention relates first of all to putties used for preparing the surfaces for varnishing, in particular shiny or "Wet-Look" varnishing hulls and superstructures in yachts. The present invention also relates to a method for producing and processing the putties.

BACKGROUND

Shiny, reflecting external surfaces of the superstructures and of the hull above the waterline are particularly desired in yacht building. To achieve this, the undercoats onto which the corresponding shiny coating systems are applied, must be uniform and smooth. Larger ships, from a length of approximately 50 meters, are usually made of steel sheets so that they exhibit typical processing traces such as welding seams. The entire hull, inclusive of the superstructures, is normally processed manually before any varnishing to obtain a uniform, faultless surface. Irregularities are thereby filled by applying a putty or a filler. The surface is sanded smooth once the filler has hardened. These working steps are repeated until the necessary surface quality has been reached. The strength of the filler layer depends on the roughness of the surface. Filler layers up to several centimeter thickness can be applied to obtain the necessary uniformity and smoothness.

Particular requirements should be met with such layer thicknesses. The hardened filler must be sufficiently elastic to avoid the formation of cracks in the filler layer, for example, in case of deformations of the hull or of temperature fluctuations. The density of the filler also plays a major part. The hardened fillers should have a comparatively minimal density to increase the total weight of the ship as little as possible with the quantities of filler masses used.

Two-component putties based on epoxy resins have to date been used. Hollow spheres of glass can be added thereto as light filling materials to reach a density of between 0.5 and 1 $g/cm^3$. These putties cannot be processed with the usual machines for processing two-component systems. The common processing machines pump both components from their respective storage containers into a mixing chamber, mix them, and evacuate the mixture out of the machine. Common modes of discharge are known to a person of skill in the art such as, for example, casting, laying up of caterpillars, and hydraulic or compressed air supported sputtering. The pressures and shear forces exerted onto the putties cause the destruction of the hollow spheres of glass. This destruction increases the density of the putty so that the hardened filler becomes significantly denser. Mechanical properties, for example, the elasticity of the hardened filler, also worsen. Ships have therefore been worked on manually using time-consuming and costly methods.

EP 1103310, also published as DE 60034646, describes a mechanical coating method in which putties according to U.S. Pat. No. 5,571,312 are used. The two-component putties on the basis of epoxy resins contain ceramic hollow spheres, among others, as a filling material. They are mechanically sufficiently stable so that they can be mechanically processed without destruction, but they have a significantly greater density than hollow spheres of glass.

SUMMARY

An aspect of the present invention is to provide improved putties which overcome the shortcomings of previously-described putties while maintaining their desired properties. An aspect of the present invention is in particular to provide putties which can be processed and applied mechanically, and to provide suitable processing methods therefor.

In an embodiment, the present invention provides a composition for producing a putty. The composition includes a binder component comprising 40 to 95 wt.-% of an epoxy resin based on a total mass of the binder component, a hardener component comprising 5 to 70 wt.-% of an NH-group-containing compound relative to a total mass of the hardener component, and 0.1 to 15 wt.-% of synthetic hollow bodies based on a total mass of the putty. The synthetic hollow bodies have a density of 0.005 to 0.8 $g/cm^3$.

DETAILED DESCRIPTION

"Fillers" or "putties" below mean mostly pigmented, high-filled coating materials which are used on irregularities made of metal, wood or fiber reinforced composites to compensate for irregularities of surfaces. The putties according to the present invention contain a binder component and a hardener component which are mixed together just before processing. The binder component hence contains one or several epoxy resins.

Suitable epoxy resins are glycidyl ethers of bisphenol A, glycidyl ethers of bisphenol F, glycidyl ethers of bisphenol A and F, epoxy Novolac resins or low-viscosity epoxy resins such as, for example, mono-, di- or polyglycidyl ethers of mono- or polyvalent alcohols or polyols, and the mixtures thereof. The epoxy resins of the present invention can, for example, be glycidyl ethers of bisphenol A, glycidyl ethers of bisphenol F, glycidyl ethers of bisphenol A and F, diglycidyl ether of hexandiol, diglycidyl ether of butandiol and monoglycidyl ethers of alcohols with 12 to 14 carbon atoms (alcohols C12 to C14) as well, as the mixtures thereof.

In an embodiment of the present invention, glycidyl ethers of bisphenol A, designated below as bisphenol A resin, can, for example, be used in quantities of 40 to 95 wt.-%, for example, 45 to 90 wt.-%, for example, 50 to 85 wt.-%, for example, 60 to 80 wt.-%, for example, 70 to 73 wt.-%, respectively relative to the mass of the binder component. In an embodiment of the present invention, glycidyl ethers of bisphenol F, designated below as bisphenol F resin, can, for example, be used in quantities of 40 to 95 wt.-%, for example, 45 to 90 wt.-%, for example, 50 to 85 wt.-%, for example, 60 to 80 wt.-%, for example, 70 to 73 wt.-%, respectively relative to the mass of the binder component. In an embodiment of the present invention, mixtures of glycidyl ethers of bisphenol A and glycidyl ethers of bisphenol F, designated below as bisphenol A/F resins, can, for example, be used in quantities of 40 to 95 wt.-%, for example, 45 to 90 wt.-%, for example, 50 to 85 wt.-%, for example, 60 to 80 wt.-%, for example, 70 to 73 wt.-%, respectively relative to the mass of the binder component.

In an embodiment of the present invention, low-viscosity epoxy resins can, for example, also be used in quantities of up to 95 wt.-%, for example, 5 to 40 wt.-%, for example, 8 to 30 wt.-%, for example, 10 to 20 wt.-%, for example, 11 to 14 wt.-%, respectively relative to the mass of the binder component.

According to the present invention, one or several NH-group-containing compounds are used in the hardener component, the compounds being selected so that the putty reacts or hardens completely at room temperature. This enables the prevention of any post-reaction in case of heat or over a longer period of time. If the putties have not hardened completely, any post-hardening at a later stage will increase the glass transition temperature $T_G$, thereby reducing the ductility of the hardened filler. The different thermal elongation coefficients of the substrate, usually steel, and of the filler cause mechanical tensions at the boundary surface between hardened filler and undercoat. The putty also shrinks during the hardening process, a process usually designated as reaction shrinkage. Mechanical tensions at the boundary surface between filler and undercoat further increase significantly due to the increased glass transition temperature.

According to the present invention, the NH-group-containing compounds suitable as hardeners can be aliphatic and cycloaliphatic amines, amides, amido amines and aromatic amines, as well as mixtures thereof. Aliphatic, cycloaliphatic amines, amido amines, and the mixtures thereof can, for example, be used. The NH-group-containing compounds can, for example, be used in quantities of 5 to 70 wt.-%, for example, 7 to 50 wt.-%, for example, 10 to 45 wt.-%, for example, 11 to 40 wt.-%, for example, 13 to 30 wt.-%, respectively relative to the hardener component.

Binder component and hardener component are used in a molar ratio of 0.5:1.5, for example, of 0.7:1.3, for example, of 0.8:1.2, for example, of 0.9:1.1, for example, of 0.98:1.02, relative to the ratio of epoxy groups to active hydrogens of NH-groups. In an embodiment of the present invention, binder component and hardener component can, for example, be used in a gravimetric mixing ratio of 2:1 to 0.5:1, for example, 1:1. In an embodiment of the present invention, the binder component and the hardener component can, for example, be used in a volumetric mixing ratio of 2:1 to 0.5:1, for example 1:1.

In an embodiment of the present invention, the composition can, for example, have bisphenol A resin in the binder component, and aliphatic and/or cycloaliphatic amines in the hardener component. In an embodiment of the present invention, the composition according to the present invention can, for example, have bisphenol A resin in the binder component, and amido amines in the hardener component. In an embodiment of the present invention, the composition according to the present invention has bisphenol A resin in the binder component, and aliphatic and/or cycloaliphatic amines as well as amido amines in the hardener component.

In an embodiment of the present invention, the composition has bisphenol A resin as well as diglycidyl ether of hexandiol in the binder component, and aliphatic and/or cycloaliphatic amines in the hardener component. In an embodiment of the present invention, the composition according to the present invention has bisphenol A resin as well as diglycidyl ether of hexandiol in the binder component, and amido amines in the hardener component. In an embodiment of the present invention, the composition according to the present invention has bisphenol A resin as well as diglycidyl ether of hexandiol in the binder component, and aliphatic and/or cycloaliphatic amines as well as amido amines in the hardener component.

In an embodiment of the present invention, the composition has bisphenol A resin as well as diglycidyl ether of butandiol in the binder component, and aliphatic and/or cycloaliphatic amines in the hardener component. In an embodiment of the present invention, the composition according to the present invention has bisphenol A resin as well as diglycidyl ether of butandiol in the binder component, and amido amines in the hardener component. In an embodiment of the present invention, the composition according to the present invention has bisphenol A resin as well as diglycidyl ether of butandiol in the binder component, and aliphatic and/or cycloaliphatic amines as well as amido amines in the hardener component.

In an embodiment of the present invention, the composition has bisphenol A resin as well as mono glycidyl ether of alcohols C12 to C14 in the binder component, and aliphatic and/or cycloaliphatic amines in the hardener component. In an embodiment of the present invention, the composition according to the present invention has bisphenol A resin as well as mono glycidyl ether of alcohols C12 to C14 in the binder component, and amido amines in the hardener component. In an embodiment of the present invention, the composition according to the present invention has bisphenol A resin as well as mono glycidyl ether of alcohols C12 to C14 in the binder component, and aliphatic and/or cycloaliphatic amines as well as amido amines in the hardener component.

In an embodiment of the present invention, the composition has bisphenol F resin in the binder component, and aliphatic and/or cycloaliphatic amines in the hardener component. In an embodiment of the present invention, the composition according to the present invention has bisphenol F resin in the binder component, and amido amines in the hardener component. In an embodiment of the present invention, the composition according to the present invention has bisphenol F resin in the binder component, and aliphatic and/or cycloaliphatic amines as well as amido amines in the hardener component.

In an embodiment of the present invention, the composition has bisphenol F resin as well as diglycidyl ether of hexandiol in the binder component, and aliphatic and/or cycloaliphatic amines in the hardener component. In an embodiment of the present invention, the composition according to the present invention has bisphenol F resin as well as diglycidyl ether of hexandiol in the binder component, and amido amines in the hardener component. In an embodiment of the present invention, the composition according to the present invention has bisphenol F resin as well as diglycidyl ether of hexandiol in the binder component, and aliphatic and/or cycloaliphatic amines as well as amido amines in the hardener component.

In an embodiment of the present invention, the composition has bisphenol F resin as well as diglycidyl ether of butandiol in the binder component, and aliphatic and/or cycloaliphatic amines in the hardener component. In an embodiment of the present invention, the composition according to the present invention has bisphenol F resin as well as diglycidyl ether of butandiol in the binder component, and amido amines in the hardener component. In an embodiment of the present invention, the composition according to the present invention has bisphenol F resin as well as diglycidyl ether of butandiol in the binder component, and aliphatic and/or cycloaliphatic amines as well as amido amines in the hardener component.

In an embodiment of the present invention, the composition has bisphenol F resin as well as mono glycidyl ether of alcohols C12 to C14 in the binder component, and aliphatic and/or cycloaliphatic amines in the hardener component. In an embodiment of the present invention, the composition according to the present invention has bisphenol F resin as well as mono glycidyl ether of alcohols C12 to C14 in the binder component, and amido amines in the hardener component. In an embodiment of the present invention, the composition according to the present invention has bisphenol F resin as well as mono glycidyl ether of alcohols C12 to C14 in the binder component, and aliphatic and/or cycloaliphatic amines as well as amido amines in the hardener component.

In an embodiment of the present invention, the composition has bisphenol A/F resins in the binder component, and aliphatic and/or cycloaliphatic amines in the hardener component. In an embodiment of the present invention, the composition according to the present invention has bisphenol A/F resins in the binder component and amido amines in the hardener component. In an embodiment of the present invention, the composition according to the present invention has bisphenol A/F resins in the binder component, and aliphatic and/or cycloaliphatic amines as well as amido amines in the hardener component.

In an embodiment of the present invention, the composition has bisphenol A/F resins as well as diglycidyl ether of hexandiol in the binder component, and aliphatic and/or cycloaliphatic amines in the hardener component. In an embodiment of the present invention, the composition according to the present invention has bisphenol A/F resins as well as diglycidyl ether of hexandiol in the binder component, and amido amines in the hardener component. In an embodiment of the present invention, the composition according to the present invention has bisphenol A/F resins as well as diglycidyl ether of hexandiol in the binder component, and aliphatic and/or cycloaliphatic amines as well as amido amines in the hardener component.

In an embodiment of the present invention, the composition has bisphenol A/F resins as well as diglycidyl ether of butandiol in the binder component, and aliphatic and/or cycloaliphatic amines in the hardener component. In an embodiment of the present invention, the composition according to the present invention has bisphenol A/F resins as well as diglycidyl ether of butandiol in the binder component, and amido amines in the hardener component. In an embodiment of the present invention, the composition according to the present invention has bisphenol A/F resins as well as diglycidyl ether of butandiol in the binder component, and aliphatic and/or cycloaliphatic amines as well as amido amines in the hardener component.

In an embodiment of the present invention, the composition has bisphenol A/F resins as well as mono glycidyl ether of alcohols C12 to C14 in the binder component, and aliphatic and/or cycloaliphatic amines in the hardener component. In an embodiment of the present invention, the composition according to the present invention has bisphenol A/F resins as well as mono glycidyl ether of alcohols C12 to C14 in the binder component, and amido amines in the hardener component. In an embodiment of the present invention, the composition according to the present invention has bisphenol A/F resins as well as mono glycidyl ether of alcohols C12 to C14 in the binder component, and aliphatic and/or cycloaliphatic amines as well as amido amines in the hardener component.

The compositions according to the present invention moreover contain synthetic hollow bodies in quantities up to 15 wt.-%, for example, 0.2 to 12 wt.-%, for example, 0.4 to 8 wt.-%, for example, 0.7 to 4 wt.-%, for example, 1.5 to 2 wt.-%, relative to the total mass of the putty. The hollow bodies of the binder component or of the hardener component or both components can thereby be used. Both components can, for example, contain hollow bodies.

Suitable hollow bodies can, for example, be hollow spheres, in particular hollow spheres with an external diameter of in average 20 to 200 µm, for example, 25 to 100 µm, for example, 30 to 60 µm. The sizes of the spheres were thereby determined by laser diffraction (Low Angle Laser Light Scattering LALLS), one of the usual methods to determine particle size. The hollow spheres also have a density of 0.005 to 0.8 g/cm$^3$, for example, 0.01 to 0.5 g/cm$^3$, for example, 0.02 to 0.03 g/cm$^3$. The density of the hollow spheres is thereby determined by the usual methods to determine the density of granules, for example, via a two-chamber-picometer-measuring device.

The density of the putties according to the present invention therefore reaches 0.25 to 1.5 g/cm$^3$, for example, 0.3 to 1.2 g/cm$^3$, for example, 0.5 to 1 g/cm$^3$.

Unlike the hollow spheres of glass previously used, the synthetic hollow spheres used according to the present invention are significantly more stable from a mechanical viewpoint. Taking the compressibility and elasticity into account, they are shear and pressure stable. If they are compressed in the processing machines such as, for example, in feeding pumps or sputtering nozzles, they will be only deformed, unlike hollow spheres of glass which are crushed and destroyed. Synthetic hollow spheres can, for example, be used which can be deformed elastically, i.e., spheres which return to their original shape after relieving the stress. The putty recovers the set density after mechanical application and hardens as desired. To manufacture the synthetic hollow spheres used according to the present invention, thermoplastic synthetic materials are employed such as, for example, acrylnitril-methacrylnitril-methyl-methacrylate copolymers or acrylnitril-vinyliden-chlorid-methylmethacrylate copolymers.

A further advantage of the putties according to the present invention is their improved sanding behavior. Unlike the hollow spheres of glass previously used, the hollow spheres of glass according to the present invention are significantly softer so that less strength must be used for sanding the hardened filler.

The combination of binder and hardener according to the present invention enables an increase of the elasticity of the hardened filler. The addition of synthetic hollow spheres according to the present invention surprisingly does not increase the mechanical stability of the putties, but further raises the elasticity of the hardened filler. The putties according to the present invention can thus better match the elongation changes of the hull, as can be caused by temperature fluctuations, and thereby show a significantly reduced tendency to form cracks.

In an embodiment, the composition according to the present invention additionally includes one or several filling materials. The quantity of the filling material used depends on the density of the filling material and the requested rigidity of the putty. According to the present invention, this can be quantities up to 90 wt.-%, for example, up to 80 wt.-%, for example, up to 40 wt.-%, respectively relative to the total mass of the putty.

Suitable materials are, for example, talcum, quartz flour, kaolin, dolomite, barium sulphate, calcium carbonate, calcite, cristobalite flour, silica, wollastonite flour, and mixtures thereof. According to the present invention, talcum, calcium carbonate, barium sulphate, quartz flour, kaolin and/or dolomite can, for example, be used.

The composition according to the present invention can further comprise one or several current pigments which are known to a person skilled in the art. Anorganic pigments such as, for example, titanium oxide, iron oxide, iron hydroxide, or chrome oxide can, for example, be used.

The composition according to the present invention can further comprise one or several current additives which are known to a person skilled in the art such as, for example, waxes, molecular sieve, defoamers, bleeders, rheology additives such as hydrogenated castor oil and pyrogenic silicic acid, plasticisers such as, for example, hydrocarbon resins or benzyl alcohol, dispersing additives, accelerators, surfaces additives, flow additives and cross-linking additives.

In an embodiment of the present invention, the putties according to the present invention contain a binder component A and a hardener component B, whereas component A contains:
40 to 95 wt.-%, bisphenol resins;
up to 15 wt.-% thixotrophatation agent;
up to 80 wt.-% pigments;
up to 80 wt.-% filling materials; and
up to 95 wt.-% low-viscosity epoxy resins,
respectively relative to the total mass of component A, and component B contains:
7 to 50 wt.-% amines and/or amido amines;
up to 20 wt.-% plasticizer;
up to 80 wt.-% pigments;
up to 80 wt.-% in filling material; and
up to 15 wt.-% thixotrophatation agent,
respectively relative to the total mass of component B. The putties also contain 0.2 to 12 wt.-% of synthetic hollow spheres relative to the total mass of the putty, whereas the hollow spheres of are added to components A or B or to both components A and B.

In an embodiment of the present invention, component A contains:
50 to 85 wt.-% bisphenol resins;
1 to 10 wt.-% thixotrophatation agent;
up to 60 wt.-% pigments;
up to 60 wt.-% filling material; and
up to 50 wt.-% low-viscosity epoxy resins,
respectively relative to the total mass of component A, and component B contains:
10 to 45 wt.-% amines and/or amido amines;
up to 10 wt.-% plasticizer;
up to 60 wt.-% pigments;
up to 60 wt.-% filling material; and
1 to 10 wt.-% thixotrophatation agent,
respectively relative to the total mass of component B. The putties also contain 0.4 to 8 wt.-% of synthetic hollow spheres relative to the total mass of the putty, whereas the hollow spheres are added to components A or B or to both components A and B.

The fillers according to the present invention are particularly elastic so that they hardly form any cracks in case of movements of the undercoat. They are mechanically stable, and are in particular stable to shear and compression, so that they can be processed mechanically without disturbing their properties, in particular, be pumped off, mixed and applied. Unlike known fillers containing hollow spheres of glass, they also have improved sanding and milling behavior.

The present invention also provides a use of the compositions in processing methods which include at least one process step carried out by a machine. By processing the putties is here meant production by dosing the binder component and the hardener component, mixing the components to obtain a homogeneous mass, and subsequent application of the putty to the undercoat to be coated. The binder component and the hardener component can then be stained in different colors to show the homogeneity of the mixture of both components.

In an embodiment of the present invention, the compositions according to the present invention are used especially for mechanical application to ship hulls and superstructures. The putties are shear and compression stable and exhibit the necessary flow characteristics so that they can be pumped off and applied in suitable machines without degrading their properties.

The aspect of the present invention is further met by a method for mechanical processing. The putties used in yacht building have to date been processed by hand or manually. The components of the putty are thereby poured into a container with the right mixing ratio, and then mixed by hand. The mixed putty is then carried in buckets or similar containers to the workplace by the ship. The putty is there applied with trowels, planks, spatula, or scoops by hand onto the ship's outer shell, and then smoothed and equalized, also by hand. After hardening, the surface of the putty layer applied is sanded and/or milled to match the contour. These processing methods are quite labor-intensive and expensive. They are also subject to error. Manual mixing of the components in an open container produces air mixtures which causes the inclusion of air in the hardened putty. When sanding, these inclusions are ground and generate pores on the surface which must again be repaired. Undiscovered air inclusions deeper in the putty layer are weak points in the coating design which cause damages and breaks in the finished varnish of the ship. Manual application often causes great differences in the applied layer thicknesses which must be sanded off and equalized. First of all, in spots where the tool must be used again, edges are formed which must sanded or milled off and equalized. Since the putties used so far have been very hard, the sanding and milling off operations require considerable strength.

The method of the present invention for the mechanical processing of the putties includes the following steps:
(a) the binder component and the hardener component are pumped into a mixing chamber, whereas the quantities are dosed so that the desired mixing ratio is maintained;
(b) both components are mixed in the mixed chamber to obtain a putty;
(c) the putty is extracted from the mixing chamber;
(d) the putty is applied on an undercoat;
(e) the applied putty hardens to form a filler; and
(f) the surface of the hardened filler is sanded or milled off to provide a smooth finish.

The putties used in the method according to the present invention exhibit the following properties:
modulus of elasticity (measured at 23° C.) in the range of 500 to 2100 MPas, for example, 500 to 1500 MPas;
elongation at break (measured at 23° C.) in the range of 0.3 to 4%, for example, 2 to 4%;
tensile strength (measured at 23° C.) in the range of 7 to 17 MPas, for example, 7 to 15 MPas;
density in the range of 0.5 to 1 g/cm$^3$;
linear coefficient of thermal expansion in the range of $0.5*10^{-4}$ to $1.5*10^{-4}$ K$^{-1}$;

Shore-D hardness in the range of 60 to 72, for example, 60 to 70; and glass transition temperature in the range of 30 to 45° C.

To obtain the most possible even and smooth surface, the steps (c) to (f) can be repeated several times if necessary. Differently stained binder components and hardener components can also be used to show the homogeneity of the mixture of both components.

In an embodiment of the present invention, the putty can, for example, be applied mechanically from the mixing chamber as well as mechanically onto the undercoat. The putties can be applied, for example, by casting, dropping caterpillars, hydraulic, or compressed air-assisted sputtering. The putties can, for example, be applied by sputtering. Suitable machines can be used to carry out the method according to the present invention such as airless spray devices for two-component systems which are familiar and known to a person skilled in the art. In these devices, the hardener component and the binder component are pumped under high pressures from their respective storage containers into the mixing container, and from there are applied through a sputtering nozzle under high pressure. The spray devices operate with pressures up to 600 bars. As a rule, the system operates at pressures between 50 and 300 bars.

A putty according to the present invention can be applied considerably faster and more uniformly than by hand via the method of the present invention. The putty is hence applied with a coat thickness of 0.5 to 50 mm, for example, of 1 to 10 mm, for example, of 2 to 5 mm.

The method according to the present invention is particularly suited for coating ship hulls and superstructures. It is suitable for processing undercoats from the materials used as a standard in ship building such as metal, wood and fiber-reinforced composites.

To obtain the desired surface aspect, the surfaces produced by the process according to the present invention are further processed using methods known by a person skilled in the art. The surface is, for example, cleaned with a fine spatula after sanding and/or milling to close any remaining air inclusions and pores. A filling grounding is then applied. The top coat or coloring base coat is then applied, which is then coated with a clear varnish.

The present invention also relates to a ship hull which has been coated with the method according to the present invention.

EXAMPLES

Example 1—Recipe According to the Present Invention

| Component | wt.-% |
| --- | --- |
| Binder Component | |
| Bisphenol A resin | 68.5 |
| Hexandiol diglycidyl ether | 9.3 |
| Talcum | 18.7 |
| Pyrogenic silicic acid | 1.9 |
| Synthetic hollow spheres | 1.6 |
| Hardener Component | |
| Commercially available epoxy resin hardener on the basis of aliphatic amines comprising 30 wt.-% of trimethyl hexamethyl diamine | 66.4 |
| Talcum | 26.6 |

-continued

| Component | wt.-% |
| --- | --- |
| Pyrogenic silicic acid | 5.7 |
| Synthetic hollow spheres | 1.3 |

Example 2—Comparative Recipe

| Component | wt. % |
| --- | --- |
| Binder Component | |
| Bisphenol A resin | 65.1 |
| Hexandiol diglycidyl ether | 8.9 |
| Talcum | 17.8 |
| Pyrogenic silicic acid | 1.8 |
| Hollow spheres of glass | 6.5 |
| Hardener Component | |
| Commercially available epoxy resin hardener on the basis of aliphatic amines comprising 30 wt.-% of trimethyl hexamethyl diamine | 63.5 |
| Talcum | 25.4 |
| Pyrogenic silicic acid | 5.5 |
| Hollow spheres of glass | 5.7 |

The binder and hardener components of Examples 1 and 2 are mixed in a molar mixing ratio of 1:1 to obtain a bubble-free homogeneous mass, then applied by hand on a sample body and left to harden for 24 hours at room temperature. In a first attempt, binder component and hardener component were mixed by hand, in a second attempt the components were mixed mechanically by means of a Bonsink filler mixing machine. The density of the hardened filler was determined using the conventional Picnometer process for measuring the density of solid bodies. The results are set forth in Table 1.

TABLE 1

| | Density of the hardened filler [g/cm³] | |
| --- | --- | --- |
| | Mixed Manually | Mixed Mechanically |
| Example 1 | 0.82 | 0.86 |
| Example 2 | 0.92 | 1.14 |

The present invention is not limited to embodiments described herein; reference should be had to the appended claims.

What is claimed is:

1. A composition for producing a putty, the composition comprising:
   a binder component comprising,
      40 to 95 wt.-% of an epoxy resin based on a total mass of the binder component,
      0.1 to 15 wt.-% of synthetic hollow bodies based on a total mass of the binder component, and
      1 to 15 wt.-% of a thixtrophatation agent based on a total mass of the binder component; and
   a hardener component comprising,
      5 to 70 wt.-% of an NH-group-containing compound based on a total mass of the hardener component,
      0.1 to 15 wt.-% of synthetic hollow bodies based on a total mass of the hardener component, and 1 to 15 wt.-% of a thixtrophatation agent based on a total mass of the hardener component, wherein, the composition includes a total amount of the synthetic hollow bodies of 0.2 to 15 wt.-% based on a total mass of the putty, the synthetic hollow bodies have a density of 0.005 to 0.8 g/cm$^3$, and the binder component and the hardener component are mixed in a gravimetric mixing ratio of from about 1:1 to 0.5:1.

2. The composition as recited in claim 1, wherein, the binder component comprises a glycidyl ether of bisphenol A, a glycidyl ether of bisphenol F, or mixtures thereof, and the hardener component comprises an aliphatic amine, a cycloaliphatic amine, an amide, an amido amine, or mixtures thereof.

3. The composition as recited in claim 1, wherein the hardener component is selected so that the putty mass reacts or hardens completely at room temperature.

4. The composition as recited in claim 1, wherein the composition comprises 0.1 to 4 wt.-% of the synthetic hollow bodies based on the total mass of the putty.

5. The composition as recited in claim 1, wherein the synthetic hollow bodies are hollow spheres.

6. The composition as recited in claim 1, wherein the putty further comprises 43.2 to <90 wt.-% of a filling material relative to the total mass of the putty.

7. The composition as recited in claim 1, wherein the binder component and the hardener component are provided in a molar ratio of 0.5:1.5 based on a ratio of epoxy groups of the at least one epoxy resin to active hydrogens of the at least one NH-group.

8. A hull coated with the putty as recited in claim 1.

9. A composition for producing a putty, the composition consisting of:

a binder component comprising 40 to 95 wt.-% of an epoxy resin based on a total mass of the binder component;

a hardener component comprising 5 to 70 wt.-% of an NH-group-containing compound relative to a total mass of the hardener component;

0.1 to 15 wt.-% of synthetic hollow bodies based on a total mass of the putty, the synthetic hollow bodies having a density of 0.005 to 0.8 g/cm$^3$;

up to 90 wt.-% of a filling material relative to the total mass of the putty;

up to 80 wt.-% of an anorganic pigment relative to the total mass of the putty; and up to 15 wt.-% of an additive, wherein, the filling material is selected from talcum, quartz flour, kaolin, dolomite, barium sulphate, calcium carbonate, calcite, cristobalite flour, silica, wollastonite flour, and mixtures thereof, the anorganic pigments is selected from a titanium oxide, an iron oxide, an iron hydroxide, and a chrome oxide, and the additive is selected from a thixtrophatation agent, a wax, a molecular sieve, a defoamer, a bleeder, a rheology additive, a plasticizer, a dispersing additive, an accelerator, a surface additive, a flow additive, and a cross-linking additive.

10. The composition as recited in claim 9, wherein, the binder component comprises a glycidyl ether of bisphenol A, a glycidyl ether of bisphenol F, or mixtures thereof, and the hardener component comprises an aliphatic amine, a cycloaliphatic amine, an amide, an amido amine, or mixtures thereof.

11. The composition as recited in claim 9, wherein the hardener component is selected so that the putty mass reacts or hardens completely at room temperature.

12. The composition as recited in claim 9, wherein the composition comprises 0.1 to 4 wt.-% of the synthetic hollow bodies based on the total mass of the putty.

13. The composition as recited in claim 9, wherein the synthetic hollow bodies are hollow spheres.

14. The composition as recited in claim 9, wherein the binder component and the hardener component are provided in a molar ratio of 0.5:1.5 based on a ratio of epoxy groups of the at least one epoxy resin to active hydrogens of the at least one NH-group.

15. The composition as recited in claim 9, wherein, the rheology additive is selected from a hydrogenated castor oil and a pyrogenic silicic acid, and the plasticizer is selected from a hydrocarbon resin or a benzyl alcohol.

* * * * *